( 12 ) United States Patent
Bhusal et al.

(10) Patent No.: US 10,522,717 B2
(45) Date of Patent: Dec. 31, 2019

(54) STRAINED ALGAINP LAYERS FOR EFFICIENT ELECTRON AND HOLE BLOCKING IN LIGHT EMITTING DEVICES (71) Applicant: Lumileds LLC, San Jose, CA (US)

(72) Inventors: Lekhnath Bhusal, San Jose, CA (US); Theodore Chung, San Jose, CA (US); Parijat Deb, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/141,154

(22) Filed: Sep. 25, 2018

(65) Prior Publication Data
US 2019/0035977 A1 Jan. 31, 2019

Related U.S. Application Data (63) Continuation of application No. 15/662,952, filed on Jul. 28, 2017, now Pat. No. 10,141,477.

(51) Int. Cl.
H01L 33/30 (2010.01)
H01L 33/36 (2010.01)
H01L 33/02 (2010.01)
H01L 33/06 (2010.01)

(52) U.S. Cl.
CPC ............ H01L 33/30 (2013.01); H01L 33/02 (2013.01); H01L 33/36 (2013.01); H01L 33/06 (2013.01)

(58) Field of Classification Search
CPC ..................................................... H01L 33/30
See application file for complete search history.

(56) References Cited

U.S. PATENT DOCUMENTS

| 5,153,889 | A | * | 10/1992 | Sugawara | ............... | B82Y 20/00 |
| | | | | | | 257/461 |
| 5,337,326 | A | | 8/1994 | Kan et al. | | |
| 5,561,301 | A | | 10/1996 | Inoue | | |
| 5,739,543 | A | | 4/1998 | Shimizu et al. | | |
| 6,597,017 | B1 | | 7/2003 | Seko et al. | | |
| 8,379,684 | B1 | | 2/2013 | Bhat et al. | | |

(Continued)

FOREIGN PATENT DOCUMENTS

WO     2006/071328     7/2006

OTHER PUBLICATIONS

Chang et al., "642-nm AlGaInP Laser Diodes with a Triple Tensile Strain Barrier Cladding Layer," in IEEE Photonics Technology Letters, vol. 10, No. 5, pp. 651-653 (May 1998).

Chang et al., "AlGaInP Yellow-Green Light-Emitting Diodes with a Tensile Strain Barrier Cladding Layer," in IEEE Photonics Technology Letters, vol. 9, No. 9, pp. 1199-1201 (Sep. 1997).

(Continued)

Primary Examiner — Thao P Le
(74) Attorney, Agent, or Firm — Volpe and Koenig, PC (57) ABSTRACT A light-emitting device is disclosed. The light emitting device includes an electron blocking layer, a hole blocking layer, wherein at least a portion of the hole blocking layer is arranged to have a compressive strain, and an active layer disposed between the hole blocking layer and the electron blocking layer. The active layer may include a first barrier layer arranged to have a tensile strain, a second barrier layer arranged to have a tensile strain, and a first well layer disposed between the first barrier layer and the second barrier layer. The active layer may also include a first unstrained barrier layer, a second unstrained barrier layer, and a second well layer disposed between the first unstrained barrier layer and the second unstrained barrier layer.

14 Claims, 7 Drawing Sheets

(56) References Cited

U.S. PATENT DOCUMENTS

| | | | |
|---|---|---|---|
| 2004/0026703 A1 | 2/2004 | Adomi et al. | |
| 2005/0236642 A1* | 10/2005 | Sakai | B82Y 20/00 257/103 |
| 2008/0191192 A1* | 8/2008 | Feezell | B82Y 20/00 257/13 |
| 2010/0171132 A1 | 7/2010 | Ahn et al. | |
| 2011/0222568 A1 | 9/2011 | Sasaki et al. | |
| 2012/0033699 A1 | 2/2012 | Sekiguchi | |
| 2014/0138614 A1* | 5/2014 | Sugiyama | B82Y 20/00 257/13 |
| 2014/0209862 A1* | 7/2014 | Ikuta | H01L 29/66462 257/22 |
| 2015/0280056 A1* | 10/2015 | Northrup | H01L 33/0025 257/13 |
| 2017/0025484 A1 | 1/2017 | Forrest et al. | |
| 2017/0092807 A1* | 3/2017 | Okuno | H01L 33/14 |
| 2017/0263600 A1 | 9/2017 | Hack et al. | |

OTHER PUBLICATIONS

Gessmann et al., "High efficiency AlGaInP light emitting diodes for solid state lighting applications," J. of Appl Phys, 95, pp. 2203-2216 (2004).

Kish et al., "AlGaInP Light Emitting Diodes," Chapter 5, Semiconductors and Semimetals, vol. 48, pp. 149 (1997).

Matthews et al., "Defects in Epitaxial Multilayers: I. Misfit Dislocations," Journal of Crystal Growth, vol. 27, pp. 118-125 (Dec. 1974).

Ritter et al., "Energy Level Alignments in Strained-Layer GaInP/AlGaInP Laser Diodes: Model Solid Theory Analysisi of Pressure-Photoluminescence Experiments." Phys. Stat, Sol. (b), 211, 869 (1999).

Streubel et al., "High brightness AlGaInP light-emitting diodes," in IEEE Journal of Selected Topics in Quantum Electronics, vol. 8, No. 2, pp. 321-332, (Mar.-Apr. 2002).

* cited by examiner

FIG. 7

STRAINED ALGAINP LAYERS FOR EFFICIENT ELECTRON AND HOLE BLOCKING IN LIGHT EMITTING DEVICES

CROSS REFERENCE TO RELATED APPLICATIONS

This application is a continuation of U.S. patent application Ser. No. 15/662,952, filed Jul. 28, 2017, which is incorporated by reference as if fully set forth.

FIELD OF INVENTION

This disclosure relates to light emitting devices, and more particularly to strained AlGaInP layers for efficient electron and hole blocking in light emitting devices.

BACKGROUND

Light emitting diodes ("LEDs") are commonly used as light sources in various applications. The main functional part of an LED can be a semiconductor chip comprising two injecting layers of opposite conductivity types (p-type and n-type), and a light-emitting active layer for radiative recombination in which injection of carriers takes place. The composition of the injecting layers, as well as the active layer, may vary by the desired wavelength. For light emissions in the red-to-amber visible wavelengths, materials from the $(Al_xGa_{1-x})_{1-y}In_yP$ alloy system can be used.

SUMMARY

According to aspects of the disclosure, a light-emitting device is disclosed that includes an electron blocking layer, a hole blocking layer, and an active layer disposed between the hole blocking layer and the electron blocking layer. The light-emitting device may be formed of material from the $(Al_xGa_{1-x})_{1-y}In_yP$ alloy system and/or any other suitable type of material. In some implementations, at least a portion of the hole blocking layer may be arranged to have a compressive strain. Additionally or alternatively, in some implementations, the active layer may be provided with at least one well structure including: a first barrier layer arranged to have a tensile strain, a second barrier layer arranged to have a tensile strain, and a well layer disposed between the first barrier layer and the second barrier layer. The active layer may include a first barrier layer arranged to have a tensile strain, a second barrier layer arranged to have a tensile strain, and a first well layer disposed between the first barrier layer and the second barrier layer. The active layer may also include a first unstrained barrier layer, a second unstrained barrier layer, and a second well layer disposed between the first unstrained barrier layer and the second unstrained barrier layer.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Group III-P semiconductor devices, such as those using the $(Al_xGa_{1-x})_{1-y}In_yP$ alloy system produce visible wavelengths of light from amber to red (e.g., 570-680 nm). Their wavelength range is achieved by adjusting the aluminum-gallium ratio during the growth of the alloy.

Examples of different lighting devices will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Figure 1:
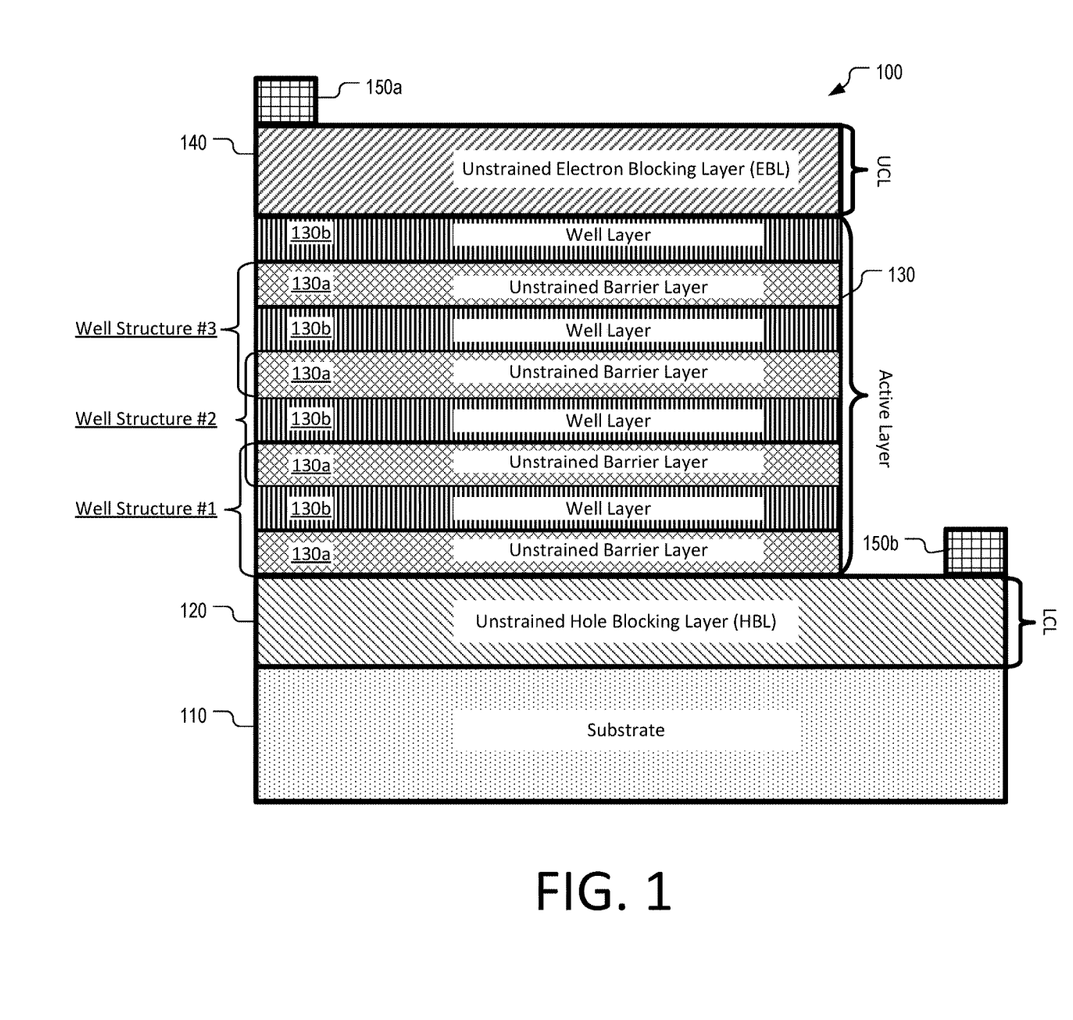
FIG. 1 is a cross-sectional diagram of an example of a light-emitting device, according to aspects of the disclosure.

FIG. 1 depicts an example of a light-emitting device 100 that is produced using the $(Al_xGa_{1-x})_{1-y}In_yP$ alloy system, according to aspects of the disclosure. The device 100 includes a substrate 110 on which an unstrained hole blocking layer (HBL) 120 is formed. The substrate 110 includes an absorbing gallium arsenide (GaAs) substrate. The hole blocking layer (HBL) 120 is formed of an n-type material from the $(Al_xGa_{1-x})_{1-y}In_yP$ alloy system. Above HBL 120, an active layer 130 is formed. The active layer 130 has $(Al_xGa_{1-x})_{1-y}In_yP$ composition and includes multiple barrier layers 130a and well layers 130b that are arranged to form a plurality of well structures. Above the active layer 130, an electron blocking layer (EBL) 140 is formed. The electron blocking layer (EBL) 140 is formed of a p-type material from the $(Al_xGa_{1-x})_{1-y}In_yP$ alloy system. Contacts 150a and 150b are disposed on HBL 120 and EBL 140, respectively, to provide means for biasing the device 100.

When a forward bias is applied to the device 100, carriers are injected into the active layer 130 where they recombine and convert their excess energy into light. Efficient operation of the device 100 thus depends on the efficient injection of carriers into the active layer 130, and an efficient recombination of the injected carriers within the active layer 130. To increase the efficiency of carrier recombination, the active layer 130 is arranged to include the plurality of well structures. Each well structure is formed of a well layer 130b sandwiched between two barrier layers 130a. In some implementations, each barrier layer 130a may be formed of a first $(Al_xGa_{1-x})_{1-y}InP$ material and each well layer 130b may be formed of a second $(Al_xGa_{1-x})_{1-y}InP$ material. In some implementations, the first $(Al_xGa_{1-x})_{1-y}InP$ material may have an aluminum ratio in the range of 0% to 30% ($0<x<0.3$). Additionally or alternatively, in some implementations, the second $(Al_xGa_{1-x})_{1-y}InP$ material may have an aluminum ratio in the range of 40% to 100% ($0.4<x<1$).

In some aspects, the amount of confinement to electrons provided by the barrier layers 130a is determined by the conduction band offsets (CBO) between the barrier layers 130a and the well layers 130b. Similarly, the amount of confinement of holes provided by the barrier layers is determined by the valence band offsets (VBO) between the barrier layers 130a and the well layers 130b. For an efficient active layer design, the CBO between the barrier layers 130a and the well layers 130b must be sufficiently large to confine electrons at high current injections and high temperature operations of the device 100. Similarly, the VBO between the barrier layers 130a and the well layers 130b must be sufficiently large to confine holes in high-current and/or high-temperature operating environments.

In high-temperature and/or high-current operating environments, carriers could escape from the active layer 130 despite the presence of well structures in the active layer 130. For this reason, EBL 140 and HBL 120 are provided on the sides of the active layer 130 to supplement the function of the barrier layers 130a and prevent carriers from overflowing out of the active layer 130. As is discussed further below with respect to FIG. 2, the degree of confinement of electrons provided by EBL 140 is proportional to the CBO between EBL 140 and the well structures within the active layer 130. Similarly, the degree of confinement of holes that is provided by HBL 120 is proportional to the VBO between HBL 120 and the active layer's 130 well structures.

Figure 2:
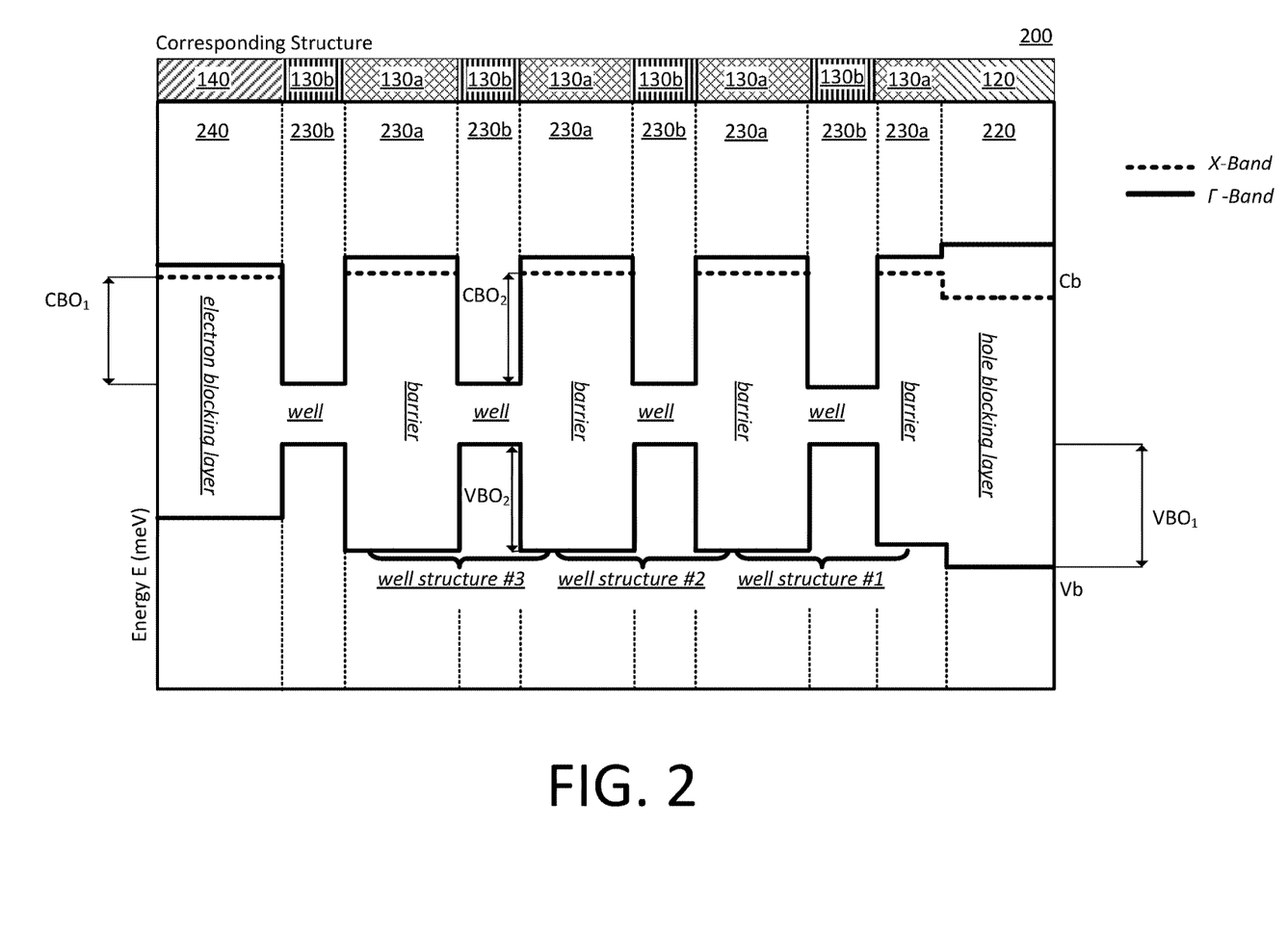
FIG. 2 is an energy band diagram of the light-emitting device of FIG. 1, according to aspects of the disclosure.

In the example of FIGS. 1 and 2, HBL 120 is the lower confinement layer (LCL) of the device 100, and EBL 140 is the upper confinement layer (UCL) of the device 100. However, in some implementations, HBL 120 may be separate from the device's 100 LCL. Additionally or alternatively, in some implementations, EBL 140 may be separate from the device's 100 UCL. In such instances, EBL and HBL could also be undoped or differently doped than UCL and LCL. Additionally or alternatively, in some implementations, there may be one or more other layers present in the UCL in addition to EBL 140. Additionally or alternatively, in some implementations, there may be one or more other layers present in the LCL in addition to HBL 120. Furthermore, it is noted that the device 100 is not limited to the above-mentioned layers and can have additional epitaxial layers grown before and after the active layer 130. In this regard, HBL 120 may be any n-type layer in the device 100 other than the active layer 130. Similarly, EBL 140 may be any p-type layer in the device 100 other than the active layer 130.

FIG. 2 is an energy band diagram 200 of the device 100 in which the valence band (Vb) and conduction band (Cb) energies of the layers 120-140 are plotted against the layers' respective spatial positions. The energies of the conduction band Cb and the valence band Vb are determined by the chemical bonds of atoms in the lattices of the layers 120-140. In the present example, the conduction band Cb is defined by the lowest of the X-band and Γ-band energies of electrons in the layers 120-140.

As illustrated, the energy band diagram 200 is divided into sections 220, 230a, 230b, and 240. Section 240 shows the valence band Vb and conduction band Cb of EBL 140. Sections 230a show the respective valence bands Vb and conduction bands Cb of the barrier layers 130a. Sections 230b show the respective valence bands Vb and conductions bands of the well layers 130b. And section 220 shows the conduction band Cb and valence band Vb of HBL 120. Also shown in FIG. 2 are the conduction band offset $CBO_1$ of EBL 140 and the valence band offset $VBO_1$ of HBL 120 with respect to the active region well material. As indicated above, the magnitude of $VBO_1$ and $CBO_1$ determines the degree of confinement of carriers in the active layer 130 that is provided by HBL 120 and EBL 140, respectively.

Conduction band offset $CBO_2$ and valence band offset $VBO_2$, respectively, are the conduction band and valence band offsets of the well structures formed by the barrier layers 130a and well layers 130b. As illustrated, the bandgap of the well layers 130b is narrower than the bandgap of the barrier layers 130a which allows carriers to move perpendicular to crystal growth, but not in the same direction. This in turn results in the confinement of higher concentrations of charge carriers in the well layers 130b and increased probability of radiative recombination.

As noted above, the magnitude of $CBO_2$ and $VBO_2$ of the well structures in the active layer 130 determines the degree of confinement of charge carriers provided by these structures. Generally, the maximum conduction band offset available for the $(Al_xGa_{1-x})_{1-y}In_yP$ alloy system is ~196 meV which can be achieved when the well layers 130b have aluminum-ratio (x) of 0% and the barrier layers 130a have aluminum-ratio (x) of 53%. This combination of aluminum (Al) and gallium (Ga) in the well layers 130b provides emission wavelength ~650-680 nm. To achieve emission of shorter wavelengths, the aluminum-ratio (x) in the well layers 130b needs to be increased, which may reduce the conduction band and valence band offsets of the well structures in the active layer 130. The reduction in the band offsets may cause a severe penalty to the electron blocking and hole blocking capabilities of the well structures in the active layer 130. This penalty is only increased at high injection and high temperature operations.

Figure 3:
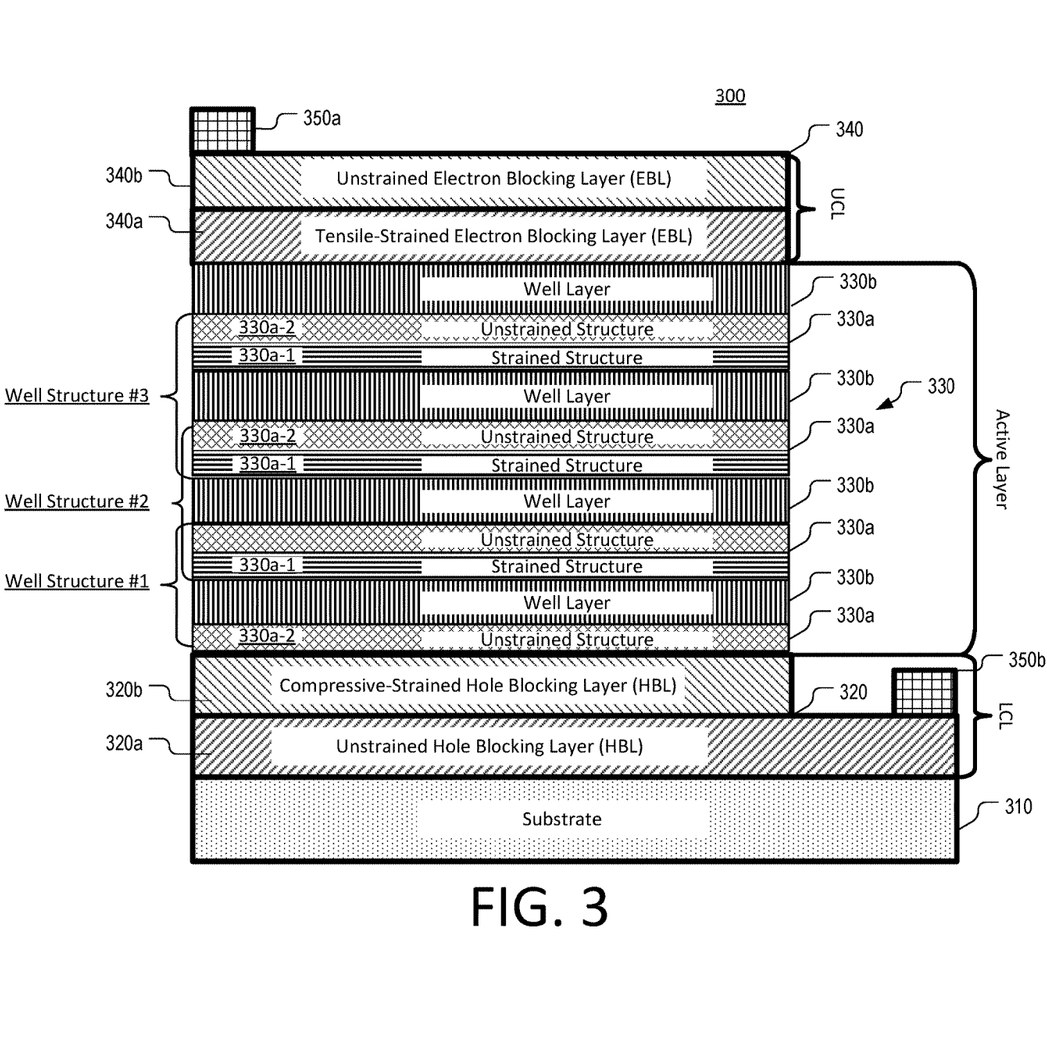
FIG. 3 is a cross-sectional diagram of an example of a light-emitting device, according to aspects of the disclosure.

FIG. 3 depicts an example of a light-emitting device 300 that is designed to counter some of the penalties associated with increased aluminum content. The device 300 includes a substrate 310, a lower confinement layer (LCL) 320, an active layer 330, and an upper confinement layer (UCL) 340. According to the present example, the substrate 210 includes an absorbing GaAs substrate. Furthermore, according to the present example, each of LCL 320, active layer 330, and UCL 340 may be formed of a material from the $(Al_xGa_{1-x})_{1-y}In_yP$ alloy system.

In some aspects, the conduction band energy of materials from the $(Al_xGa_{1-x})_{1-y}In_yP$ alloy system is affected by the aluminum-ratio of those materials. More particularly, for materials from the $(Al_xGa_{1-x})_{1-y}In_yP$ alloy system with aluminum-ratio below 53% (0<x<0.53), the Γ-band is the lowest conduction band and the alloy behaves as a direct band gap material. By contrast, when the aluminum-ratio is greater than 53% (0.53<x<1) in the $(Al_xGa_{1-x})_{1-y}In_yP$ alloy system, the X-band defines the confinement of the electrons in the active layer 330 and individual well structures within the active layer 330, and in EBL (or UCL). Thus, when the aluminum-ratio is greater than 53% (0.53<x<1), the greater the energy level of the X-band in the barrier layers 330a and UCL 340, the more efficient the confinement of electrons in the active layer 330 and individual well structures therewithin.

One way to increase the energy level of the X-band for materials from the $(Al_xGa_{1-x})_{1-y}In_yP$ alloy system is to induce a tensile strain in the lattice of those materials. When the indium-ratio is 49% (y=0.49), materials from the $(Al_xGa_{1-x})_{1-y}In_yP$ alloy system are lattice matched to the GaAs substrate for 0>x>1. When the indium-ratio is reduced below 49% (0<y<0.49), tensile strain may be induced in the materials from the $(Al_xGa_{1-x})_{1-y}In_yP$ alloy system when they are formed on a GaAs or Si substrate with appropriate adjustments for the lattice mismatch between the Si lattice and the AlGaInP. In the presence of tensile strain, the energy of the Γ-band of the materials is decreased with respect to the conduction band edge at the rate of ~85 meV/GPa and the energy of the X-band is increased with respect to conduction band edge at the rate of 25 meV/GPa. The amount of the X-band energy increase depends on the amount of tensile strain, but is limited by the critical thickness of the strained material.

The device 300 incorporates a tensile-strained electron blocking layer to achieve improved electron confinement. As illustrated in FIG. 3, UCL 340 includes a (p-type) tensile strained electron blocking layer 340a and a (p-type) unstrained electron blocking layer 340b. The tensile-strained electron blocking layer 340a is formed of a material from the $(Al_xGa_{1-x})_{1-y}In_yP$ alloy system and may have an indium-ratio less than 49% (0<y<0.49). The presence of indium in percentages less than 49% causes the accumulation of tensile strain in the lattice of the electron blocking layer 340a, which in turn may widen its bandgap and enhance its electron blocking capabilities. Additionally or alternatively, in some implementations, the electron blocking layer 340a may include aluminum-ratio greater than 53% (0.53<x<1).

The unstrained electron blocking layer 340b may be formed of a material from the $(Al_xGa_{1-x})_{1-y}In_yP$ alloy system. In some implementations, the indium-ratio (y) of the unstrained electron blocking layer 340b may equal 49% (y=0.49), thereby causing the unstrained electron blocking layer 340b to be lattice-matched to the GaAs substrate 310. Additionally or alternatively, in some implementations, the aluminum ratio (x) of the unstrained electron blocking layer 340b may be in the range of 40% to 100% (0.4≤x≤1).

Turning to the active layer 330, the active layer 330 includes multiple strained barrier layers 330a and well layers 330b arranged to form a set of well structures. Each well structure includes a well layer 330b disposed between two strained barrier layers 330a. At least some of the barrier layers 330a include a strained structure 330a-1 and an unstrained structure 330a-2, as shown. Each of the strained structures 330a-1 may be formed of a material from the $(Al_xGa_{1-x})_{1-y}In_yP$ alloy system having an indium-ratio less than 49% (0<y<0.49) and aluminum-ratio greater than 53% (0.53<x<1). Each of the strained structures 330a-1 may have thickness that is lower than the critical thickness of the material it is formed of to avoid relaxation. Each unstrained barrier layer structure 320a-2 may be formed of a material from the $(Al_xGa_{1-x})_{1-y}In_yP$ alloy system having an indium ratio (y) of 49% (y=0.49) and aluminum ratio (x) greater than 40% (0.4<x<1). As discussed above, the presence of indium in the barrier layers 330a (or portions thereof) in percentages less than 49% may induce the accumulation of tensile strain in the respective lattices of the barrier layers 330a, thereby widening their bandgap and enhancing their electron-blocking capabilities.

In some implementations, all of the barrier layers 330a may have the same thickness. Additionally or alternatively, in some implementations, at least two of the barrier layers 330a may have different thicknesses. In some implementations, all of the well layers 330b may have the same thickness. Additionally or alternatively, in some implementations, at least two of the well layers 330b may have different thicknesses. In this regard, the present disclosure is not limited to any specific absolute or relative physical dimensions for the barrier layers 330a and the well layers 330b.

Although in the present example the barrier layer 320 that is depicted next to the HBL 320b includes a single unstrained structure 320-1, alternative implementations are possible in which the barrier layer 320a that is depicted next to the HBL 320b includes one or more strained structures in addition to the unstrained structure 320-1. Furthermore, alternative implementations are possible in which each of the barrier layers 320a consists of a single strained structure 320a-1. And still furthermore, alternative implementations are possible in which any number of strained and/or unstrained structures are present in any of the barrier layers 320a. Stated succinctly, the present disclosure is not limited to the number and/or types of structures that are found in any of the barrier layers 320a.

As discussed above, at least some of the barrier layers 330a and the electron blocking layer 340a are strained to better confine electrons within the active layer 330 and individual well structures within the active layer 330. However, increasing electron confinement alone may not be enough for efficient operation of the device 300. For efficient device operation, hole blocking can be as critical as electron blocking at high-temperature and high-current operations.

For efficient hole blocking by HBL, the energy of the valence band should be decreased with respect to the valence band of quantum wells to increase the VBO1. In contrast to electron blocking, efficient hole blocking may be achieved by introducing a compressive strain into the lattice of hole blocking layers. More particularly, compressive strain in $(Al_xGa_{1-x})_{1-y}In_yP$ materials can be achieved by increasing the indium-ratio (y) above 49% (0.49<y<1).

The device 300 incorporates a compressively strained hole blocking layer (HBL) 320b to achieve improved hole confinement. More particularly, LCL 320 layer is formed of materials in the $(Al_xGa_{1-x})_{1-y}In_yP$ alloy system and it includes an (n-type) unstrained hole blocking layer 320a and an (n-type) compressive-strained hole blocking layer 320b. The indium-ratio of the unstrained hole blocking layer is 49% (y=0.49) which results in the unstrained hole blocking layer (HBL) 320a being lattice-matched with the GaAs substrate 310. The indium-ratio of the compressive-strained HBL 320b may be above 49% (0.49<y<1), which results in the accumulation of compressive strain in the hole blocking layer 320b. In some implementations, the thickness of the compressive-strained hole blocking layer may be lower than the critical thickness of the layer's material to avoid relaxation which might generate defects in the crystal.

Figure 4:
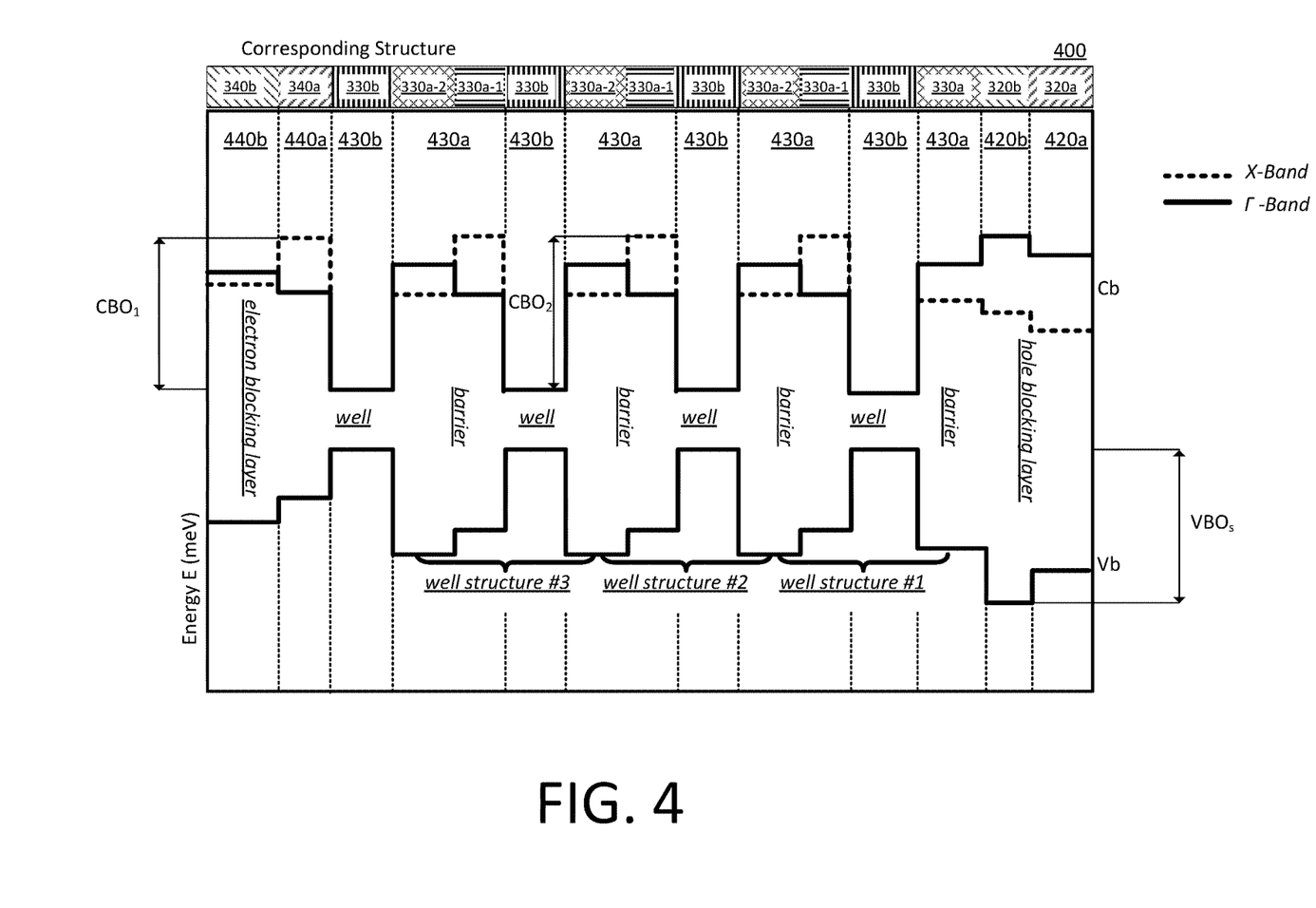
FIG. 4 is an energy band diagram of the light-emitting device of FIG. 3, according to aspects of the disclosure.

FIG. 4 is an energy band diagram 400 of the device 300 in which the valence band (Vb) and conduction band (Cb) energies of the layers 320-340 are plotted against the layers' respective spatial positions. As illustrated, the energy band diagram 400 includes sections 420a, 420b, 430a, 430b, 440a, and 440b. Section 440b shows the valence band Vb and conduction band Cb of the unstrained electron blocking layer (EBL) 340b. Section 440a shows the valence band Vb and conduction band Cb of the tensile-strained electron blocking layer (EBL) 340a. Sections 430a show the respective valence bands Vb and conduction bands Cb of the strained barrier layers 330a. Sections 430b show the respective valence bands Vb and conduction bands Cb of the well layers 330b. Section 420b shows the valence band Vb and conduction band Cb of the strained hole blocking layer (HBL) 320b. And section 420a shows the valence band Vb and conduction band Cb of the unstrained hole blocking layer 320a.

In the example of FIGS. 3 and 4, the layers 320-340 are formed of materials from the $(Al_xGa_{1-x})_{1-y}In_yP$ alloy system. More particularly, the strained barrier layer structures 330a-1 and the electron blocking layer 340a are each formed of a material from the $(Al_xGa_{1-x})_{1-y}In_yP$ alloy system in which the aluminum-ratio of the material exceeds 53% (0.53<x<1) and the indium-ratio is below 49% (0<y<0.49). The presence of more than 53% aluminum in the layers 330a and 340a causes the conduction band Cb of those layers to be defined by the energy of their X-band, while the presence of less than 49% indium in the layers introduces tensile strain in the layers' lattices and causes their X-band energy to increase with respect to the conduction band, as a result. As noted above, the increase of X-band energy of the strained barrier layer structures 330a-1 and the electron blocking layer 340a widens their respective bandgaps and enhances their electron blocking capabilities.

The increase of X-band energy of the strained barrier layer structures 330a-1 is illustrated in sections 440a and 430a of the energy band diagram 400. Each of these sections shows a spike in the X-band energy which is not present in sections 240a and 230b of the energy band diagram 200. Notably, each of the spikes in X-band energy is caused by the presence of a respective strained barrier structure 330a-1, as shown. It will be recalled that sections 240 and 230b of the energy band diagram 200 show the X-band energy of unstrained barrier layers 120a and unstrained electron blocking layer (EBL) 140, whereas sections 440a and 430a show the X-band energy of tensile-strained barrier layer structures 330a-1 and tensile-strained electron blocking layer (EBL) 340a. Thus, sections 440a and 430a illustrate an increase in X-band energy (and therefore conduction band energy) that is generated when tensile strain is induced in materials from the $(Al_xGa_{1-x})_{1-y}In_yP$ alloy system. The tensile strain of the barrier layer structures 330a-1 and the electron blocking layer 340a, as noted above, is induced by maintaining their indium-ratio below 49% (0<y<0.49) when the layers 330a and 340a are grown on a GaAs substrate.

Also shown in FIG. 4 are the conduction band offset $CBO_1$ of the strained electron blocking layer 440a and the conduction band offset $CBO_2$ of the strained barrier layer structures 330a-1. As illustrated, the increase in the X-band energy of the strained electron blocking layer 440a and the strained barrier layer structures 330a-1 increases their respective conduction band offsets, thereby enhancing their capability to prevent electrons from escaping the active layer 330 and individual well structures within the active layer 330.

In the example of FIGS. 3 and 4, the strained hole blocking layer 320b is formed of a material from the $(Al_xGa_{1-x})_{1-y}In_yP$ alloy system in which the indium-ratio is above 49% (0.49<y<1). The increase of the indium-ratio above 49% induces compressive strain in the lattice of the hole blocking layer 320b, which in turn causes its valence band energy Vb to decrease. The decrease in valence band energy with respect to the valence band edge of the quantum wells is illustrated in section 420b of the band diagram 400. As illustrated in section 420b, the valence band energy of the compressive-strained HBL 320b juts down relative to the valence band energy of the unstrained HBL 320a. This stands in contrast to section 220 of the band diagram 200, which shows that the energy of the valence band of the HBL 120 lacks the energy drop that is visible in section 420b. As discussed above, the decrease in valence band energy of the hole blocking layer 320b enhances its hole blocking capabilities rendering the device 300 more suitable for use in high-temperature and/or high-current applications.

Also, shown in FIG. 4 is the valence band offset $VBO_s$ of the strained hole blocking layer 320b. As illustrated, the decrease in the valence band energy of the hole blocking layer 320b results in an increased valence band offset along with an enhanced capability of preventing holes from overflowing from the active layer 330.

Stated succinctly, in the examples of FIGS. 3 and 4, device 300 is a light-emitting device that is formed by epitaxially growing layers 320a-340b on a substrate 310 along an axis that is perpendicular to the substrate plane, the axis extending from the substrate plane towards the layer 340. Each of the layers 320a-340b is characterized by a respective thickness, the thickness being that layer's width along the growth axis. In the example of FIGS. 3 and 4, the substrate 310 and includes a GaAs substrate. HBL 320a is formed above the substrate 310 includes a material from the $(Al_xGa_{1-x})_{1-y}In_yP$ alloy system, where (0.4<x<1.00) and (y=0.49). In some implementations, HBL 320b may have a thickness in the range of 0-1000 nm. HBL 320b is formed above HBL 320a and includes a material from the $(Al_xGa_{1-x})_{1-y}In_yP$ alloy system, where (0.4<x<1.00) and (0.49<y<0.7). In some implementations, HBL 320b may have a thickness in the range of 0-1000 nm. In some implementations, the thickness of the HBL 320b may be lower than the critical thickness of the material it is formed of to avoid relaxation.

Barrier layers 330a are formed above the HBL 320b and may have a thickness in the range of 1-1000 nm. Each of the barrier layers 330a may include one or more strained structures 330a-1 and/or one or more unstrained structures 330a-2. Each strained structure 330a-1 may be formed of a material from the $(Al_xGa_{1-x})_{1-y}In_yP$ alloy system in which the aluminum-ratio of the material exceeds 53% (0.53<x<1) and the indium-ratio is below 49% (0<y<0.49). The thickness of the strained structures may be lower than the critical thickness of the material which the strained structures are formed of to avoid relaxation. Each unstrained barrier layer structure 330a-2 may be formed of a material from the $(Al_xGa_{1-x})_{1-y}In_yP$ alloy system, where (y=0.49) and (0.4<x<1). Furthermore, as noted above, any of the barrier layers 330a may include one or more strained structures. Strained layer could be comprised of multiple layers of different amount of strains or graded strains across the strained layers. Well layers 330b are interleaved with the barrier layer 330a to form a plurality of well structures. Any of the well layers 330b may include a material from the $(Al_xGa_{1-x})_{1-y}In_yP$ alloy system, where (0<x<0.3) and (0<y<0.49). In some implementations, any of the well layers 330b may have a thickness in the range of 1-100 nm.

EBL 340a is formed above the barrier layers 330a and well layers 330b and may include a material from the $(Al_xGa_{1-x})_{1-y}In_yP$ alloy system, where (0.53<x<1.00) and (0.2<y<0.49). In some implementations, EBL 340a may have a thickness in the range 0-1000 nm. In some implementations, the thickness of the EBL 340a may be within the critical thickness of the material which EBL 340a is formed of to avoid relaxation. EBL 340b is formed above EBL 340a and includes a material from the $(Al_xGa_{1-x})_{1-y}In_yP$ alloy system, where (0.40<x<1.00) and (y=0.49). In some implementations, EBL 340b may have a thickness in the range 0-1000 nm.

In the present example, layers 320a-b are part of the lower confinement layer (LCL) of the device 300, and layers 340a-b are part of the upper confinement layer (UCL) of the device 300. However, in some implementations, any of the layers 320a-b and 340a-b may be separate from the device's 300 LCL and UCL. Although in the present example, the hole blocking layers 320a-b are formed closer to the substrate 310 than the electron blocking layers 340a-b, alternative implementations are possible in which the electron blocking layers 340a-b are formed closer to the substrate 310 than the hole blocking layers 320a-b. Additionally or alternatively, in some implementations, any of the layers 320a-b may be part of the device's 300 UCL and any of the layers 340a-b may be part of the device's 300 LCL.

Furthermore, it should be noted that the above thickness ranges, aluminum-ratios, and indium-ratios are provided only as an example. Furthermore, it should be noted that alternative implementations are possible in which one or more of the above-discussed, layers are omitted. Non-limiting examples of such implementations are discussed further below with respect to FIGS. 5-7.

Figure 5:
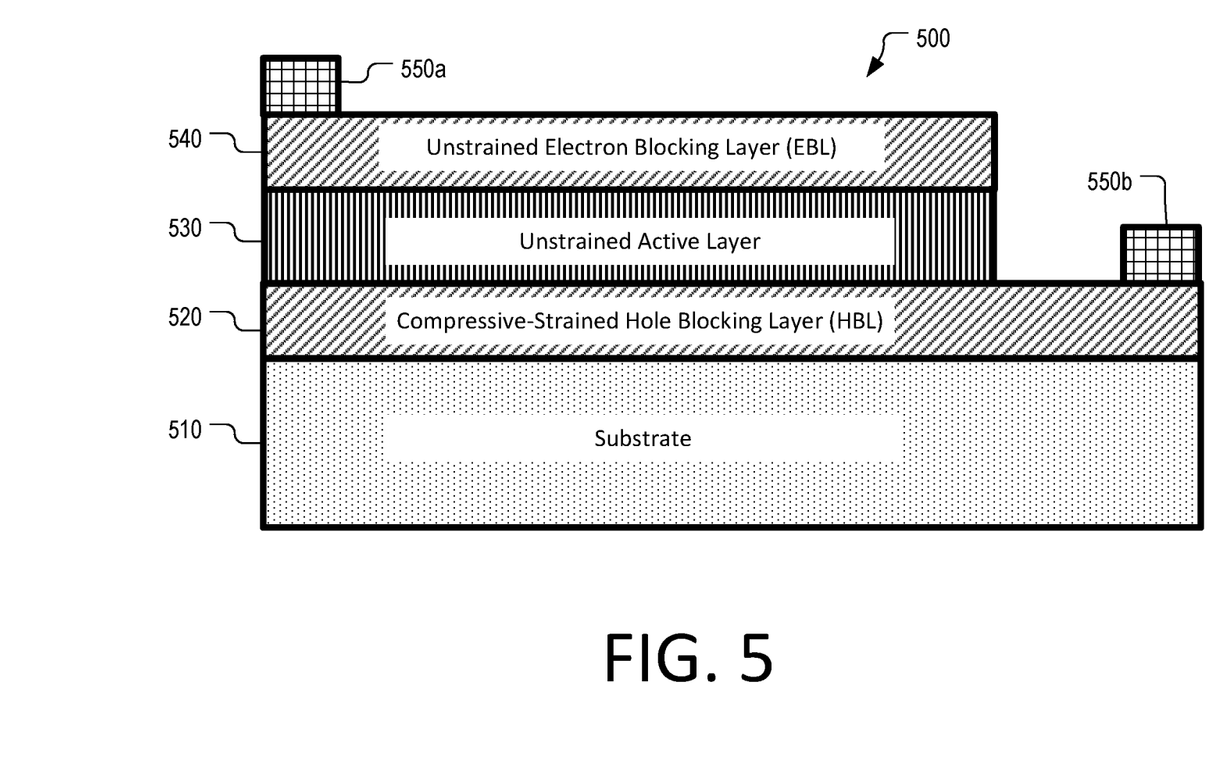
FIG. 5 is a cross-sectional diagram of an example of a light-emitting device, according to aspects of the disclosure.

FIG. 5 depicts an example of a light-emitting device 500, according to aspects of the disclosure. As illustrated, the device 500 includes a substrate 510, a (n-type) hole blocking layer (HBL) 520, an active layer 530, a (p-type) electron blocking layer (EBL) 540, and contacts 550a and 550b formed on EBL 540 and HBL 520, respectively. The substrate 510 may include a GaAs substrate or any suitable type of substrate. The HBL 520 is formed above the substrate 510 and its lattice may be compressively strained. The HBL 520 may include a material from the $(Al_xGa_{1-x})_{1-y}In_yP$ alloy system and/or any suitable type of material. When the HBL 520 includes a material from the $(Al_xGa_{1-x})_{1-y}In_yP$ alloy system, the indium-ratio of the layer 520 may exceed 49% (0.49<y) which results in the accumulation of compressive strain in the lattice of the HBL 520. In some implementations, the thickness of the compressive-strained HBL may be lower than the critical thickness of the layer's material to avoid relaxation which might generate defects in the crystal.

The active layer 530 is formed above the HBL 520. The active layer 530 may be formed of a material having an $(Al_xGa_{1-x})_{1-y}In_yP$ composition and/or any other suitable type of material. In the present example, the active layer 530 has a homogenous structure, but alternative implementations are possible in which the structure of the active layer 530 is heterogeneous. The electron blocking layer (EBL) 540 is formed above the active layer 530. EBL 540 may include a material from the $(Al_xGa_{1-x})_{1-y}In_yP$ alloy system and/or any other suitable type of material. Although in the present example EBL 540 has a homogeneous structure, alternative implementations are possible in which the structure of EBL 540 is heterogeneous. Although in the present example EBL 540 is unstrained, alternative implementations are possible in which tensile strain is induced in the lattice of EBL 540.

Figure 6:
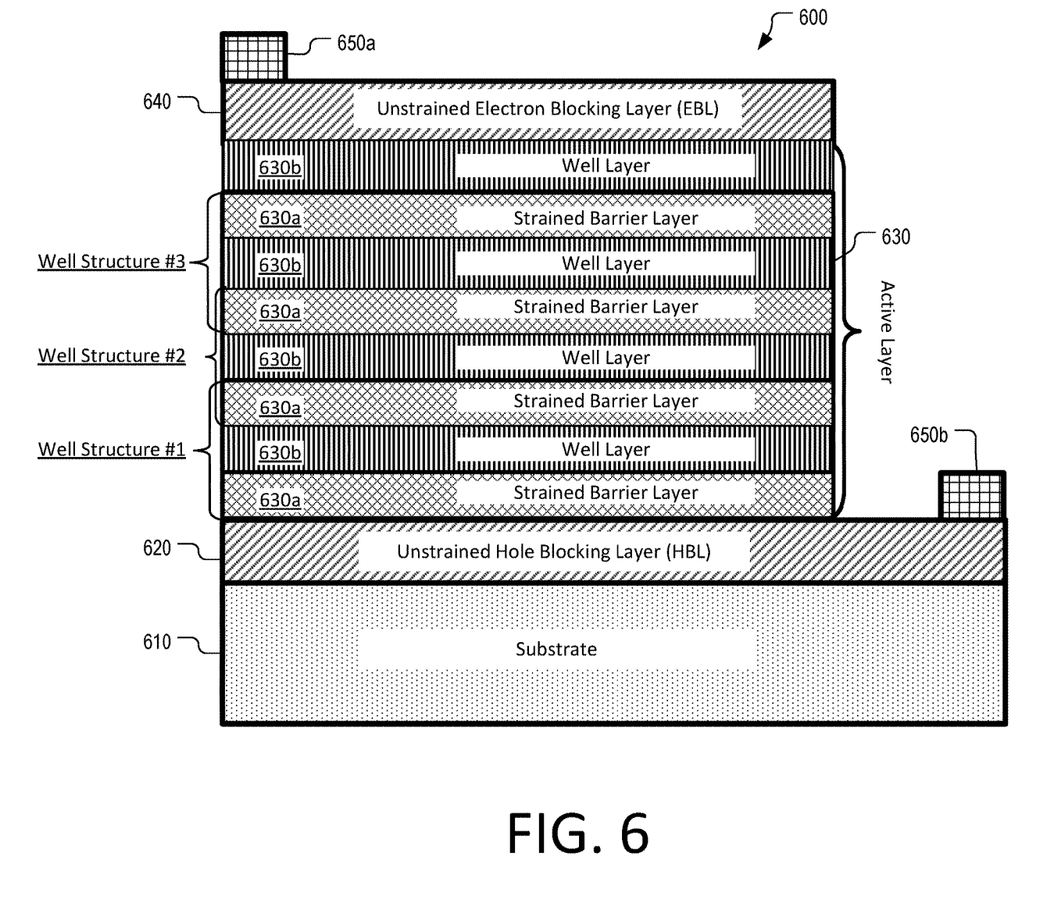
FIG. 6 is a cross-sectional diagram of an example of a light-emitting device, according to aspects of the disclosure.

FIG. 6 depicts an example of a light-emitting device 600, according to aspects of the disclosure. As illustrated, the device 600 includes a substrate 610, an (n-type) hole blocking layer (HBL) 620, an active layer 630, a (p-type) electron blocking layer (EBL) 640, and contacts 650a and 650b formed on EBL 640 and HBL 620, respectively. The substrate 610 may include a GaAs substrate or any other suitable type of substrate. The hole blocking layer (HBL) 620 is formed above the substrate 610. HBL 620 may be formed of a material from the $(Al_xGa_{1-x})_{1-y}In_yP$ alloy system and/or any other suitable type of material. Although in the present example HBL 620 has a homogeneous structure, alternative implementations are possible in which the HBL 620 has a heterogeneous structure. Although in the present example HBL 620 is unstrained, alternative implementations are possible in which the lattice of HBL 620 is induced to have a compressive strain. The active layer 630 is formed above HBL 620 and it may be formed of a material from the $(Al_xGa_{1-x})_{1-y}In_yP$ alloy system and/or any other suitable type of material. The electron blocking layer (EBL) 640 is formed above the active layer 630. The electron blocking layer (EBL) 640 may include a material from the $(Al_xGa_{1-x})_{1-y}In_yP$ alloy system and/or any other suitable type of material. Although in the present example EBL 640 has a homogeneous structure, alternative implementations are possible in which the structure of EBL 640 is heterogeneous. Although in the present example EBL 640 is unstrained, alternative implementations are possible in which tensile strain is induced in the lattice of EBL 640.

According to the example of FIG. 6, the active layer 630 includes a plurality of barrier layers 630a and a plurality of well layers 630b that are arranged to form a plurality of well structures. Each well structure may include a well layer 630b disposed between two strained barrier layers 630a. Each of the barrier layers may be formed of a material from the $(Al_xGa_{1-x})_{1-y}In_yP$ alloy system having an indium-ratio below 49% (0<y<0.49) and/or any other suitable type of material. As discussed above, the presence of less than 49% of indium in the composition of the barrier layers 630a may result in the accumulation of tensile strain in their respective lattices, which in turn can widen the barrier layers' 630a bandgaps and enhance their electron-blocking capabilities. Although in the present example each of the barrier layers 630a includes a single strained structure, alternative implementations are possible in which each of the barrier layers 630a includes both strained and unstrained structures.

Figure 7:
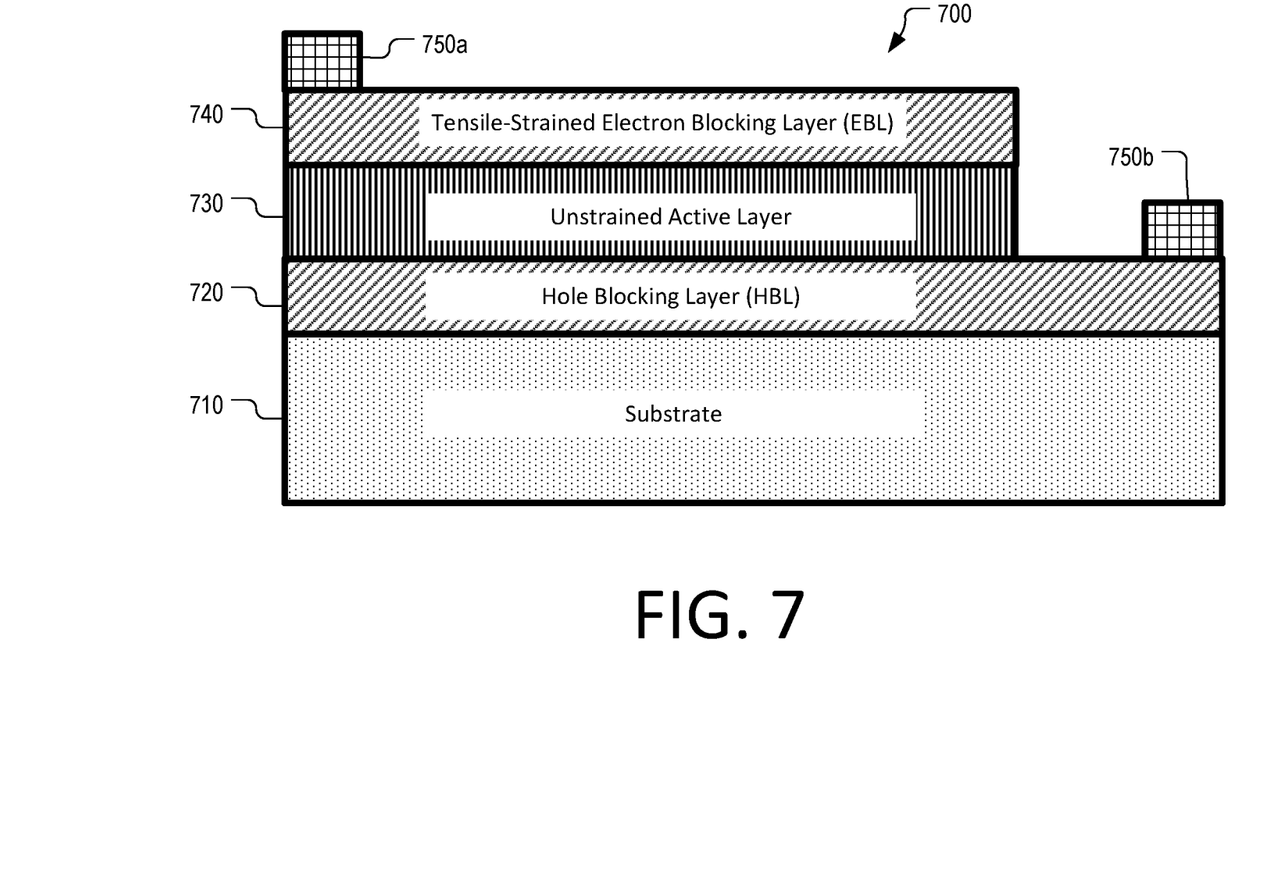
FIG. 7 is a cross-sectional diagram of an example of a light-emitting device, according to aspects of the disclosure.

FIG. 7 depicts an example of a light-emitting device 700, according to aspects of the disclosure. As illustrated, the device 700 may include a substrate 710, an (n-type) hole-blocking layer (HBL) 720, an active layer 730, a (p-type) tensile-strained electron blocking layer (EBL) 740, and contacts 750a and 750b formed on EBL 740 and HBL 720, respectively.

The substrate 710 may include a GaAs substrate or any suitable type of substrate, such as a Si substrate for example. HBL 720 is formed above the substrate 710 and it may include a material from the $(Al_xGa_{1-x})_{1-y}In_yP$ alloy system and/or any suitable type of material. The active layer 730 is formed above the hole blocking layer. The active layer 730 may be formed of a material having a $(Al_xGa_{1-x})_{1-y}In_yP$ composition and or any other suitable type of material. In the present example, the active layer 730 has a homogenous structure, but alternative implementations are possible in which the structure of the active layer 730 is heterogeneous. EBL 740 is formed above the active layer 730. EBL 740 may include a material from the $(Al_xGa_{1-x})_{1-y}In_yP$ alloy system having an aluminum-ratio greater than 53% (0.53<x<1) and indium-ratio below 49% (0<y<0.49). As discussed above, the presence of less than 49% of indium in the composition of EBL 740 may result in the accumulation of tensile strain in its lattice, which in turn can enhance its electron-blocking capabilities. Although in the present example EBL 740 has a heterogeneous structure, alternative implementations are possible in which the structure of EBL 740 is heterogeneous.

FIGS. 1-7 are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples.

Although the examples provided throughout the disclosure are described in the context of the $(Al_xGa_{1-x})_{1-y}In_yP$ alloy system, it should be noted that the disclosure is not limited to this system only. Furthermore, although in the above examples the hole blocking layers are situated closer to the substrate than the electron blocking layers, alternative implementations are possible in which the electron blocking layers are grown closer to the substrate than hole blocking layers.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A light-emitting device, comprising:
    an electron blocking layer;
    a hole blocking layer, at least a portion of the hole blocking layer having a compressive strain; and
    an active layer disposed between the hole blocking layer and the electron blocking layer, the active layer including:
        a first barrier layer having a first tensile strain,
        a second barrier layer having a second tensile strain,
        a first well layer disposed between the first barrier layer and the second barrier layer,
        a first unstrained barrier layer,
        a second unstrained barrier layer, and
        a second well layer disposed between the first unstrained barrier layer and the second unstrained barrier layer.

2. The light-emitting device of claim 1, wherein the electron blocking layer has a composition represented as $(Al_xGa_{(1-x)})_{1-y}In_yP$, where 0.4<x<1 and 0.2<y<0.7.

3. The light-emitting device of claim 1, wherein:
    the electron blocking layer includes a first p-type layer and a second p-type layer,
    the first p-type layer is unstrained, and
    the second p-type layer has a third tensile strain.

4. The light-emitting device of claim 1, further comprising a GaAs substrate, wherein:
    the hole blocking layer, the electron blocking layer, and the active layer are on the same side of the GaAs substrate, and
    each of the hole blocking layer, the electron blocking layer, and the active layer is formed of a respective material from a system of AlGaInP.

5. A light-emitting device, comprising:
    an electron blocking layer, at least a portion of the electron blocking layer having a first tensile strain;
    a hole blocking layer, at least a portion of the hole blocking layer having a compressive strain; and
    an active layer between the hole blocking layer and the electron blocking layer, the active layer including one or more of a first well structure and one or more of a second well structure, the first well structure including a first barrier layer that has a second tensile strain, a second barrier layer that has a third tensile strain, and a first well layer disposed between the first barrier layer and the second barrier layer, and the second well structure including a first unstrained barrier layer, a second unstrained barrier layer, and a second well layer disposed between the first unstrained barrier layer and the second unstrained barrier layer;
    the electron blocking layer being part of one of an upper confinement layer of the light emitting device and a lower confinement layer of the light-emitting device, an the hole blocking layer being part of the other one of the upper confinement layer of the light emitting device and the lower confinement layer of the light-emitting device.

6. The light-emitting device of claim 5, wherein the hole blocking layer has a composition represented as $(Al_xGa_{(1-x)})_{1-y}In_yP$, where 0.4<x<1 and 0.49<y<0.7.

7. The light-emitting device of claim 5, wherein:
    the hole blocking layer includes a first n-type layer and a second n-type layer,
    the first n-type layer is unstrained,
    the second n-type layer is strained compressively,
    the first n-type layer has a composition represented as $(Al_xGa_{(1-x)})_{1-y}In_yP$, where 0≤x≤1 and 0.49≤y≤1.

8. The light-emitting device of claim 5, wherein the electron blocking layer has a composition represented as $(Al_xGa_{(1-x)})_{1-y}In_yP$, where 0.4≤x≤1 and 0.2≤y≤0.7.

9. The light-emitting device of claim 5, wherein the electron blocking layer includes a first unstrained p-type layer and a second p-type layer that has a fourth tensile strain.

10. A light-emitting device, comprising:
    an electron blocking layer;
    a hole blocking layer, the hole blocking layer including a first unstrained n-type layer and a second n-type layer that has a compressive strain; and
    an active layer between the hole blocking layer and the electron blocking layer, the active layer including one or more of a first well structure and one or more of a second well structure,
    the first well structure including a first barrier layer that has a first tensile strain, a second barrier layer that has a second tensile strain, and a well layer disposed between the first barrier layer and the second barrier layer, the first barrier layer and the second barrier layer having a composition represented as $(Al_xGa_{(1-x)})_{1-y}In_yP$, where 0.4<x<1 and 0<y<0.49,
    the second well structure including a first unstrained barrier layer, a second unstrained barrier layer, and a second well layer disposed between the first unstrained barrier layer and the second unstrained barrier layer; and
    the first n-type layer being formed of a first material from a system of AlGaInP, the second n-type layer formed of a second material from the system of AlGaInP that has a greater indium-ratio than the first material.

11. The light-emitting device of claim 10, wherein the electron blocking layer includes a first unstrained p-type layer and a second p-type layer that has a third tensile strain.

12. The light-emitting device of claim 1, wherein the first tensile strain and the second tensile strain are the same.

13. The light-emitting device of claim 5, wherein at least two of the first tensile strain, the second tensile strain, and the third tensile strain are the same.

14. The light-emitting device of claim 10, wherein the first tensile strain and the second tensile strain are the same.

\* \* \* \* \*